(12) United States Patent
Thraenhardt et al.

(10) Patent No.: US 10,873,868 B2
(45) Date of Patent: Dec. 22, 2020

(54) APPARATUS FOR MEASURING RADIO FREQUENCY POWER AS WELL AS METHOD OF ANALYZING A RADIO FREQUENCY SIGNAL

(71) Applicant: Rohde & Schwarz GmbH & Co. KG, Munich (DE)

(72) Inventors: Marcel Thraenhardt, Freising (DE); Thomas Braunstorfinger, Munich (DE); Georg Schnattinger, Dorfen (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 0 days.

(21) Appl. No.: 15/999,069

(22) Filed: Aug. 16, 2018

(65) Prior Publication Data

US 2020/0059803 A1 Feb. 20, 2020

(51) Int. Cl.
*G01R 31/08* (2020.01)
*H04W 24/08* (2009.01)

(52) U.S. Cl.
CPC .................................. *H04W 24/08* (2013.01)

(58) Field of Classification Search
USPC ........... 370/251, 252, 311, 328, 342, 395.21, 370/395.41, 253, 310, 320, 335, 344, 447
See application file for complete search history.

(56) References Cited

U.S. PATENT DOCUMENTS

| | | | |
|---|---|---|---|
| 2002/0163979 A1* | 11/2002 | Takatz | H04B 1/28 375/345 |
| 2011/0295102 A1* | 12/2011 | Lakkis | A61B 5/00 600/407 |
| 2013/0286863 A1* | 10/2013 | Silverman | H04L 5/001 370/252 |

* cited by examiner

*Primary Examiner* — Phuongchau Ba Nguyen
(74) *Attorney, Agent, or Firm* — Christensen O'Connor; Johnson Kindness PLLC

(57) ABSTRACT

An apparatus for measuring radio frequency power is described that comprises at least one measurement path for small bandwidth and at least one measurement path for wide bandwidth. Further, the apparatus has an analysis and measurement unit connected with the at least two measurement paths. The analysis and measurement unit is configured to process the at least one small bandwidth signal and the at least one wide bandwidth signal. Further, a method of analyzing a radio frequency signal is described.

18 Claims, 1 Drawing Sheet

APPARATUS FOR MEASURING RADIO FREQUENCY POWER AS WELL AS METHOD OF ANALYZING A RADIO FREQUENCY SIGNAL

FIELD OF THE DISCLOSURE

Embodiments of the present disclosure relate generally to an apparatus for measuring radio frequency power. Further, embodiments of the present disclosure relate generally to a method of analyzing a radio frequency signal.

BACKGROUND

Modern telecommunication devices, for instance, use radio frequency signals for transmitting data wherein the radio frequency signals have a wide bandwidth so that high data rates can be ensured. Therefore, these radio frequency signals are also called wideband signals or rather broadband signals. The wideband signals may comprise several narrowband frequency ranges each being used for certain transmission purposes, in particular certain channels and/or certain data packages. Typically, the respective narrowband frequency ranges each have different center frequencies so that they can be distinguished from each other. In general, it may be of interest to investigate a narrowband signal portion of the wideband signal while investigating the overall wideband signal simultaneously. In some embodiments, interrelations may be detected by investigating the narrowband signal portion and the wideband signal.

So far, a power meter as well as a separately formed spectrum analyzer are used for conducting such measurements as the power meter is used to measure the overall power of the (broadband) radio frequency signal, whereas the spectrum analyzer is used to analyze a certain narrowband signal portion of the radio frequency signal. Both devices, namely the power meter and the separately formed spectrum analyzer, are connected to the device under test emitting the radio frequency signal to be investigated. For connecting purposes, a separately formed splitter may be interconnected between the device under test and the power meter as well as the spectrum analyzer. The splitter splits the radio frequency signal to be analyzed so that the split signals are forwarded to both devices, namely the power meter and the spectrum analyzer for analyzing purposes.

Since a spectrum analyzer is a very expensive test and measurement device, the overall costs of the test equipment and the testing itself are high.

Therefore, there is a need for obtaining information with regard to the power of a radio frequency signal and narrowband portions in a cost-efficient manner.

SUMMARY

Embodiments of the present disclosure provide an apparatus for measuring radio frequency power, comprising:

at least two measurement paths, the at least two measurement paths having at least one measurement path for small bandwidth via which at least one small bandwidth signal is processed and at least one measurement path for wide bandwidth via which at least one wide bandwidth signal is processed; and an analysis and measurement unit connected with the at least two measurement paths, the analysis and measurement unit being configured to measure the power the at least one small bandwidth signal and the at least one wide bandwidth signal.

Furthermore, embodiments of the present disclosure provide a method of analyzing a radio frequency signal, with the following steps:

receiving a radio frequency signal via a single apparatus;
processing the radio frequency signal received via the single apparatus so as to obtain at least one small bandwidth signal and at least one wide bandwidth signal; and
measuring the power of at least one of the at least one small bandwidth signal and the at least one wide bandwidth signal by using the single apparatus.

Accordingly, a single apparatus is provided that houses the at least two different measurement paths that are assigned to a small bandwidth (narrowband) and a wide bandwidth (wideband or rather broadband). Thus, the single apparatus is configured to process a wideband signal and a narrowband signal. In some embodiments, the narrowband signal may correspond to a portion of the wideband signal so that a certain frequency area is selected from the radio frequency signal, namely the wideband signal, for being processed separately by the apparatus. Accordingly, the small bandwidth signal may be a frequency selective one since a certain frequency range or rather a certain frequency span is clipped of the radio frequency signal received.

Generally, the wideband signal as well as the narrowband signal processed by the single apparatus may correspond to the same radio frequency signal that is input into the single apparatus, for example via a single input of the apparatus.

The analysis and measurement unit is configured to process the respective signals, namely the broadband signal and the narrowband signal, so as to measure the respective power of these signals individually. Hence, the power of the small bandwidth signal as well as the power of the wide bandwidth signal may be obtained.

In some embodiments, the apparatus is configured to provide information with regard to the overall power of the radio frequency signal as well as the power of a certain frequency range of the radio frequency signal wherein the certain frequency range is defined by the small bandwidth signal, namely the narrowband signal. The certain frequency range may be selected (frequency selection).

Therefore, a spectrum analyzer is no longer needed so that a compact and cost-efficient apparatus is provided that can be used for measuring the radio frequency power, for example the entire power as well as a frequency-selected power, namely the one of the small bandwidth signal.

Generally, the apparatus according to the present disclosure corresponds to a combined power meter since the single apparatus, namely the combined power meter, is enabled to measure the power of different frequency ranges (e.g., simultaneously).

The apparatus may comprise several measurement paths for wide bandwidth as well as several measurement paths for small bandwidth. Hence, several different narrow frequency ranges may be measured simultaneously due to the several measurement paths for small bandwidth.

According to an aspect, the analysis and measurement unit may be further configured to compare at least one predefined threshold value with at least one of a difference in power of the small bandwidth signal and the at least one wide bandwidth signal and an absolute power of at least one of the at least one small bandwidth signal and the at least one wide bandwidth signal.

With regard to the method, at least one predefined threshold value is compared with at least one of a difference in power of the at least one small bandwidth signal and the at least one wide bandwidth signal and the absolute power of at least one of the at least one small bandwidth signal and the at least one wide bandwidth signal.

Thus, the analysis and measurement unit may comprise a memory in which at least one threshold value is stored so that a predefined threshold value is provided that can be used by the analysis and measurement unit for comparison purposes. The analysis and measurement unit is configured to compare the at least one threshold value with a difference in power of the signals processed, namely a difference in power of the broadband signal and the narrowband signal. Hence, the powers of both signals are subtracted from each other so as to obtain the difference in power that may be used for comparison purposes with the predefined threshold value.

Alternatively or additionally, the analysis and measurement unit is configured to compare the at least one predefined threshold value with an absolute power of the small bandwidth signal and/or to compare the at least one predefined threshold value with an absolute power of the wide bandwidth signal. Thus, the absolute power measured of the respective signals may be compared with the at least one predefined threshold value. In some embodiments, the overall power of the radio frequency signal, namely the radio frequency power or rather the absolute power of the wide bandwidth signal, may be compared with the threshold value. Simultaneously, the power of the narrowband signal, namely the small bandwidth signal, may be compared with another predefined threshold value.

In general, several predefined threshold values may be stored in the memory that are taken into account for different comparison purposes, namely one predefined threshold value for the difference in power, one predefined threshold value for the absolute power of the broadband signal and/or one predefined threshold value for the absolute power of the narrowband signal.

According to an aspect, the analysis and measurement unit is configured to indicate whether or not the at least one threshold value is at least one of reached or exceeded. Thus, the user of the apparatus gets informed by the apparatus whether the power measured or rather the power value obtained, for instance the difference in power, is higher than the at least one threshold value. Accordingly, the apparatus can be used for checking the device under test emitting the radio frequency signal that is input to the apparatus. The indication provided by the analysis and measurement unit may be a warning with regard to the power, namely the overall power of the radio frequency signal such as an overload warning or a frequency selective power, for instance the power of a certain frequency range of the radio frequency signal (e.g., the power of the small bandwidth signal).

Moreover, the frequency range of the at least one measurement path for small bandwidth is tunable. Thus, the frequency range processed by the measurement path for small bandwidth can be adapted so that the usable frequency can be adapted (frequency selection). In some embodiments, different frequency ranges can be checked with the apparatus in a subsequent manner when adapting or rather tuning the frequency range usable of the measurement path for small bandwidth.

In addition, at least one of the at least two measurement paths is assigned to a down-converter. The down-converter may select a certain frequency range of the (wideband) radio frequency signal received. Further, the down-converter may ensure that the respective radio frequency signal received may be converted to a certain frequency range, for instance an intermediate frequency. The down-converter may be assigned to the at least one measurement path for small bandwidth. In addition, the down-converter may be controlled appropriately so that a certain frequency range can be set that is processed by the measurement path. Accordingly, the frequency range can be tuned via the down-converter.

In other words, the down-converter may be used for analyzing the radio frequency signal in a certain frequency range selected (frequency span or rather frequency range), namely a signal portion, that is part of the (broadband) radio frequency signal input. Simultaneously, the signal portion may be shifted to an intermediate frequency. For instance, the down-converter is enabled to process a frequency span of 1200 MHz over the entire bandwidth of the (broadband) radio frequency signal that may comprise a frequency range of 2 to 22 GHz, for instance.

Alternatively or additionally, an adjustable filter may be provided that can be controlled appropriately so as to set a certain frequency range or rather frequency span for the at least one measurement path for small bandwidth.

According to an embodiment, at least one sampler is provided that is assigned to the analysis and measurement unit. The sampler or rather digitizer may digitize the analog signal processed by the measurement path so that a continuous-time signal is reduced to a discrete-time signal for further processing. For instance, a first sampler may be assigned to the measurement path for wide bandwidth whereas a second sampler is assigned to the measurement path for small bandwidth. Regarding the measurement path for small bandwidth, the sampler may be situated between the down-converter and the analysis and measurement unit so that a down-converted signal may be sampled by the second sampler whereas the first sampler directly samples the radio frequency signal processed by the measurement path for wide bandwidth.

Generally, at least one measurement path is provided wherein the signal processed by this measurement path is directly sampled. In addition, at least one other measurement path is provided wherein the signal processed by this measurement path is down-converted and sampled afterwards.

The analysis and measurement unit may be configured to measure the signals in the at least two measurement paths in parallel or sequentially. Thus, the analysis and measurement unit is generally enabled to perform at least two (e.g., power) measurements simultaneously due to the at least two different measurement paths. Accordingly, information with regard to the small frequency range, namely the narrowband frequency range, may be obtained simultaneously with information regarding the (e.g., broadband) radio frequency signal processed by the measurement path for wide bandwidth, for instance.

Alternatively, the signals may be measured in a sequential manner, for example the respective powers of the signals, namely the small bandwidth signal and the wide bandwidth signal.

According to a certain embodiment, the analysis and measurement unit has at least two operation modes, the first operation mode corresponding to measuring the signals in the at least two measurement paths sequentially, the second operation mode corresponding to measuring the signals in the at least two measurement paths in parallel. The user may select a certain operation mode of the analysis and measurement unit so that the user decides whether or not the power of the signals processed by both measurement paths are measured sequentially or rather in parallel.

Another aspect provides that an adjustable attenuator is provided, the adjustable attenuator being connected with the analysis and measurement unit. Therefore, the analysis and measurement unit may be configured to control the adjustable attenuator appropriately so that the attenuation provided by the attenuator may be adjusted in dependency of a control signal output by the analysis and measurement unit. In some embodiments, the analysis and measurement unit may adapt the attenuator setting according to a power measured. This can be done in response to the overall power of the radio frequency signal, namely the absolute power of the wideband signal, or rather the absolute power of the small bandwidth signal or any other analysis results obtained from the power(s) measured.

In some embodiments, the adjustable attenuator is positioned in front of the at least two measurement paths. Thus, the signals are attenuated prior to being processed by the measurement paths.

Another aspect provides that the analysis and measurement unit is configured to indicate at least one of a too high power, a wrong attenuator setting and a wrong frequency range for the at least one measurement path for small bandwidth. The analysis and measurement unit may obtain the respective information due to the signals received via the measurement paths, for example the respective power(s) measured. For instance, an analyzing result of the analysis and measurement unit is assigned to a wrong attenuator setting and/or a wrong frequency range selected (e.g., for the narrowband signal) so that this analyzing result can be output. Thus, the user is informed appropriately. The user may adapt the corresponding setting appropriately, namely the one of the attenuator or rather the measurement path for small bandwidth. The indication regarding too high power may correspond to an overload warning, for example when referring to the absolute power of the wide bandwidth signal.

In addition, the analysis and measurement unit may be configured to at least one of average the power of the wide bandwidth signal and to determine the peak value of the power of the wide bandwidth signal. In other words, the analysis and measurement unit may average the power of the wide bandwidth signals over a certain time period and/or the analysis and measurement unit may determine the peak value of the power of the high bandwidth signal. The respective power value obtained, namely the average power value and/or the peak value, may be used for comparison and/or processing purposes.

In other words, the analysis and measurement unit may comprise a typical power sensor that may be established by a thermal component and/or a diode.

Furthermore, an internal splitter may be provided that is assigned to an input of the apparatus, the splitter splitting a radio frequency signal received via the input, the splitter forwarding the split signals to the at least two measurement paths. Thus, the internal splitter that is integrated in the apparatus splits the radio frequency signal received which may originate from the device under test. The split signals are internally processed by the apparatus, for example the respective measurement paths, so as to obtain the small bandwidth signal and the wide bandwidth signal. Hence, the small bandwidth signal as well as the wide bandwidth signal correspond to the split signals assigned to a common radio frequency signal.

According to another embodiment, a display is provided that is connected with the analysis and measurement unit so that measurement and analysis results are displayed on the display. The display may be used for indicating the respective measurement and/or analyzing results so that, for instance, the measurement values of the absolute power of at least one of the signals may be displayed appropriately, namely the total power measured of the small bandwidth signal and/or the total power measured of the wide bandwidth signal. Accordingly, both powers measured may be displayed simultaneously on the common display.

Furthermore, analyzing results such as warning notifications regarding an overload (when exceeding a threshold value) or any other notifications may be displayed on the display.

The apparatus may be used as a reference circuit. In some embodiments, the at least two measurement paths may be used for calibrating purposes, for example calibrating external equipment connected with the apparatus.

According to an aspect, the radio frequency signal received is at least one of attenuated and split. The attenuation of the radio frequency signal received may be done by the adjustable attenuator that is controlled by the analysis and measurement unit. The splitter may be located downstream of the attenuator so that the attenuated signal is split. In some embodiments, the adjustable attenuator as well as the internal splitter are parts of the single apparatus so that they are encompassed by the housing of the apparatus.

As already discussed, the radio frequency signal received may be attenuated in dependency of the power measured. Thus, the analysis and measurement unit may control the adjustable attenuator depending on the measurement and/or analyzing results. Hence, the attenuator setting may be done automatically by the analysis and measurement unit.

Further, the radio frequency signal received may be down-converted so as to obtain the at least one small bandwidth signal. Thus, a down-converter may be provided that is controlled appropriately so that a certain frequency range of the small bandwidth signal can be selected. Alternatively or additionally, an adjustable filter is used for selecting a certain frequency range that corresponds to the small bandwidth signal.

The power of the wide bandwidth signal may be averaged or the peak value of the power of the high bandwidth signal may be taken into account. Thus, the respective power value assigned to the wide bandwidth signal may correspond to an average value and/or a peak value.

For instance, the user of the apparatus may select a certain measurement mode or rather operation mode according to which the average value and/or the peak value is taken into account.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
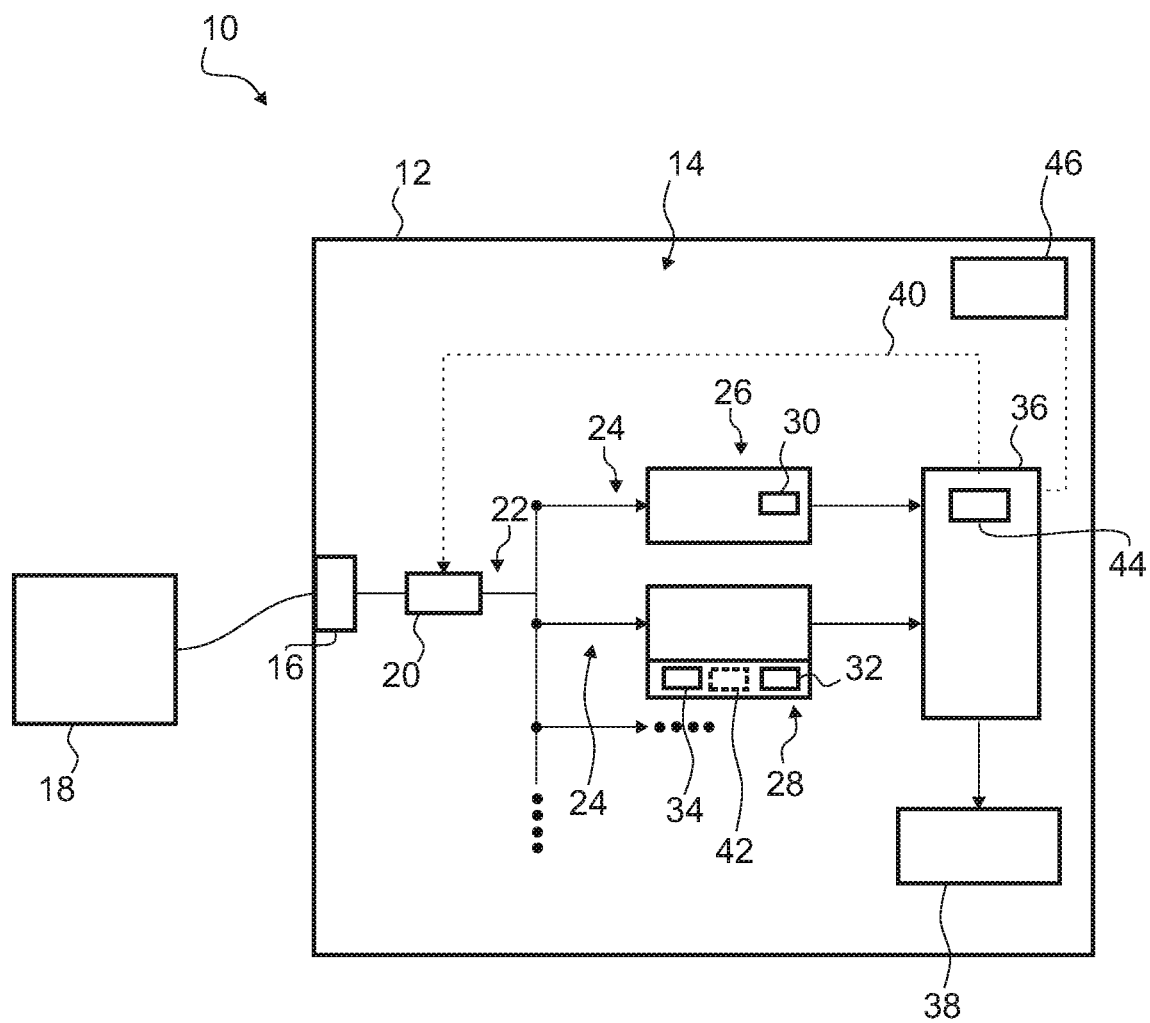
FIG. 1 shows a schematic overview of an apparatus according to the present disclosure.

In FIG. 1, an apparatus 10 for measuring a radio frequency power of a radio frequency signal is shown. The apparatus 10 comprises a housing 12 that encompasses several (e.g., internal and electronic) components 14 of the apparatus 10 as will be described hereinafter.

The apparatus 10 has an input 16 via which a radio frequency signal of a device under test 18 may be input that is connected with the input 16 as shown in FIG. 1. The input 16 is connected with an adjustable attenuator 20 that processes the radio frequency signal received from the device under test 18 while attenuating the respective radio frequency signal. This ensures that the radio frequency signal can be processed internally by the apparatus 10.

The attenuator 20 is connected with an internal splitter 22 that splits the (attenuated) radio frequency signal and forwards the split signals obtained to several measurement paths 24. In the shown embodiment, two measurement paths 24 are shown in more detail.

One of the at least two measurement paths 24 corresponds to a measurement path for wide bandwidth 26 whereas the other measurement path 24 corresponds to a measurement path for small bandwidth 28. Accordingly, both measurements paths 26, 28 process different signals with regard to the bandwidth. The measurement path for wide bandwidth 26 processes signals being wideband compared to the signals processed by the measurement path for small bandwidth 28.

Both measurement paths 26, 28 each comprise a sampler 30, 32, namely a first sampler 30 as well as a second sampler 32, so that the analog signals processed by the respective measurement paths 26, 28 are digitized for further analyzing purposes. The measurement path for small bandwidth 28 may also comprise a down-converter 34 that ensures that the split signal received from the splitter 22 is down-converted wherein a certain frequency range may be selected. Thus, the measurement path for small bandwidth 28 corresponds to a frequency selective one.

In some embodiments, the certain frequency range may be selected from the overall broadband frequency range of the radio frequency signal received. Hence, the small bandwidth signal processed by the measurement path for small bandwidth 28 corresponds to a portion of the radio frequency signal received.

In addition, the apparatus 10 comprises an analysis and measurement unit 36 that is connected with the measurement paths 24, namely the measurement path for wide bandwidth 26 as well as the measurement path for small bandwidth 28. Accordingly, the respective signals processed are forward to the analysis and measurement unit 36 so that information is retrieved from the respective signals by performing measurements and/or analyses.

The analysis and measurement unit 36 is connected to a display 38 that is located at an outer side of the housing 12 of the apparatus 10 so that the information displayed is visible for the user of the apparatus 10. The analysis and measurement unit 36 is also directly connected with the adjustable attenuator 20 via a control line 40 so that the adjustable attenuator 20 may be controlled by the analysis and measurement unit 36 as will be described later with reference to FIG. 2.

Figure 2:
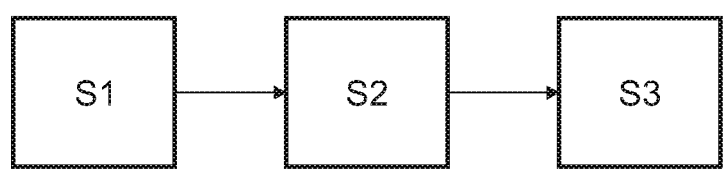
FIG. 2 shows a flow-chart representing a method according to the present disclosure.

The function of the analysis and measurement unit 36 will also be explained hereinafter while referring to FIG. 2 which shows a flow-chart illustrating the method of analyzing a radio frequency signal. A radio frequency signal output by the device under test 18 is input to the apparatus 10 via the input 16 so that a radio frequency signal is received (step S1). Then, the radio frequency signal received via the input 16 is processed by the apparatus 10 internally so as to obtain at least one small bandwidth signal and at least one high bandwidth signal (step S2).

The high bandwidth signal may correspond to the radio frequency signal received with regard to the bandwidth. Alternatively, the overall bandwidth of the radio frequency signal received is split into several high bandwidth signals that are processed by different measurement paths for wide bandwidth 26. However, the several high bandwidth signals together provide the overall bandwidth of the radio frequency signal received.

In general, the processing step (step S2) comprises attenuating the radio frequency signal received by using the adjustable attenuator 20 and splitting the (attenuated) radio frequency signal via the splitter 22 so that the respective split signals are forwarded to the at least two measurement paths 24 for further processing.

For instance, the split signal processed by the measurement path 28 for small bandwidth is down-converted by the down-converter 34 so that a frequency selection can be done appropriately. This means that a certain frequency range or a certain frequency span of the radio frequency signal input is selected for further investigation. Alternatively, an (e.g., adjustable) filter 42 may be used instead of the down-converter 34 for selecting a certain frequency range of the split signal corresponding to the radio frequency signal received. The split signal processed by the measurement path 26 for wide bandwidth is not converted.

In other words, the split signals correspond to a wide bandwidth signal that is processed by the at least one measurement path for wide bandwidth 26 as well as a small bandwidth signal that is processed by the at least one measurement path 28 for small bandwidth.

At the end of step S2, the respective signals are sampled via the samplers 30, 32 so that digital signals are obtained which are forwarded to the analysis and measurement unit 36 for further processing, for example performing measurements and/or analyzing the respective signals.

In general, the analysis and measurement unit 36 is configured to measure the power of at least one of the signals, namely the small bandwidth signal and/or the high bandwidth signal (step S3). In some embodiments, the respective measurements are done simultaneously so that the information is obtained directly.

The analysis and measurement unit 36 may comprise a diode and/or a thermal component for measuring the power of the wide bandwidth signal. Thus, the diode and/or the thermal component are/is assigned to the at least one measurement path for wide bandwidth 26.

Once the respective powers have been measured, the analysis and measurement unit 36 may compare at least one predefined threshold value stored within a memory 44 of the analysis and measurement unit 36 with a difference in power of the signals, namely the difference in power of the small bandwidth signal and the high bandwidth signal. Alternatively or additionally, the analysis and measurement unit 36 may compare the at least one predefined threshold value with the absolute power of the small bandwidth signal and/or the analysis and measurement unit 36 may compare the at least one predefined threshold value with the absolute power of the high bandwidth signal.

Thus, the analysis and measurement unit 36 is generally configured to simultaneously obtain information with regard to the overall power of the radio frequency signal received via the input 16, namely by taking the power of the wide bandwidth signal into account, and to obtain information of a certain frequency range of the radio frequency signal, namely by taking the power of the small bandwidth signal into account.

The respective measurements and analyses may be done simultaneously in a first operation mode of the analysis and measurement unit 36, for example the overall apparatus 10. Alternatively, the user may select a second operation mode in which the respective signals, namely the broadband signal and the narrowband signal, are measured in a subsequent manner. Therefore, the respective measurements are done sequentially.

The measurement and analyzing results obtained by the analysis and measurement unit 36 may be displayed on the display 38 so as to inform the user with regard to the information obtained. Accordingly, the power measured may be displayed, for instance the one of the narrowband signal and/or the one of the broadband signal.

In some embodiments, warning notifications may be displayed on the display 38 due to any analyzing results so as to warn the user with regard to a certain setting of the apparatus 10. For instance, the user may be warned with regard to a wrong setting of the adjustable attenuator 20 and/or a wrong frequency range selected for the small bandwidth signal. However, a warning notification may also be output due to a too high power measured, for instance a too high power of the wideband signal. This respective warning notification may correspond to an overload warning.

In some embodiments, the analysis and measurement unit 36 may be configured to automatically control the adjustable attenuator 20 so that a wrong setting of the attenuator 20 is prohibited effectively.

In general, the frequency range of the at least one measurement path for small bandwidth 28 may be tunable since the down-converter 34 (or rather the filter 42) can be set appropriately. This can be done via a user interface 46 of the apparatus 10 or rather the analysis and measurement unit 36 itself.

For instance, a testing scenario is applied in which different small bandwidth ranges are tested in a subsequent manner so that the at least one tunable measurement path for small bandwidth 28 is tuned differently, for example in a subsequent manner.

The power of the wide bandwidth signal may relate to an average power of the wide bandwidth signal processed by the at least one measurement path for wide bandwidth 26. Alternatively, the power of the wide bandwidth signal corresponds to a peak value of the power of the wide bandwidth signal determined. The user may select whether the power shall be averaged or the peak value shall be used for analyzing purposes, for example for the comparison.

In some embodiments, a combined power meter is provided by the apparatus 10. The combined power meter or rather the apparatus 10 is configured to measure the power of a broadband signal while simultaneously measuring the power of a narrowband signal. The respective powers measured may be displayed simultaneously.

The narrowband signal may correspond to a narrowband signal portion of the broadband radio frequency signal received wherein the narrowband frequency range may be selected. Put it another way, the respective frequency range of the narrowband can be set.

The apparatus 10 may also provide a reference circuit so as to calibrate the device under test 18 connected with the apparatus 10.

Since the combined power meter, namely the apparatus 10, can be used for doing the respective measurements, the overall costs of analyzing the radio frequency signal are reduced significantly as no spectrum analyzer is needed which is expensive.

Various components of the apparatus 10 may include, in some embodiments, logic for implementing the technologies and methodologies described herein. This logic can be carried out in either hardware or software, or a combination of hardware and software. For example, in some embodiments, the filter, the down-converter, the attenuator, the analysis and measurement unit, and/or the sampler includes one or more computing devices to implement the methodologies and technologies described herein. The computing devices may include but are not limited to a processor (e.g., a microprocessor), a central processing unit (CPU), a digital signal processor (DSP), an application-specific integrated circuit (ASIC), a field-programmable gate array (FPGA), or the like, or any combinations thereof, analog circuits or digital circuits or combinations thereof, and can include discrete digital or analog circuit elements or electronics, or combinations thereof.

In an embodiment, one or more of the aforementioned components includes a microprocessor and a memory storing logic modules and/or instructions. In an embodiment, one or more of the aforementioned components includes one or more ASICs having a plurality of predefined logic components. In an embodiment, one or more of the aforementioned components includes one or more FPGA having a plurality of programmable logic components. In an embodiment, one or more of the aforementioned components includes hardware circuit implementations (e.g., implementations in analog circuitry, implementations in digital circuitry, and the like, and combinations thereof). In an embodiment, the one or more of the aforementioned components includes combinations of circuits and computer program products having software or firmware instructions stored on one or more computer readable memories that work together to cause a device to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An apparatus for measuring radio frequency power, comprising:
a housing;
at least two measurement paths, said at least two measurement paths having at least one measurement path for small bandwidth via which at least one small bandwidth signal is processed and at least one measurement path for wide bandwidth via which at least one wide bandwidth signal is processed, said at least two measurements paths processing different signals with regard to the bandwidth; and an analysis and measurement unit connected with said at least two measurement paths, said analysis and measurement unit being configured to measure the power of said at least one small bandwidth signal and said at least one wide bandwidth signal, wherein said housing houses said at least two different measurement paths, and wherein said analysis and measurement unit is configured to indicate at least one of a too high power, a wrong attenuator setting or a wrong frequency range for said at least one measurement path for small bandwidth by comparing at least one predefined threshold value with an absolute power of said at least one small bandwidth signal and/or said at least one wide bandwidth signal.

2. The apparatus according to claim 1, wherein said analysis and measurement unit is further configured to compare at least one predefined threshold value with a difference in power of said small bandwidth signal and said at least one wide bandwidth signal.

3. The apparatus according to claim 2, wherein said analysis and measurement unit is configured to indicate whether or not said at least one threshold value is at least one of reached or exceeded.

4. The apparatus according to claim 1, wherein the frequency range of said at least one measurement path for small bandwidth is tunable.

5. The apparatus according to claim 1, wherein at least one of said at least two measurement paths is assigned to a down-converter.

6. The apparatus according to claim 1, wherein at least one sampler is provided that is assigned to said analysis and measurement unit.

7. The apparatus according to claim 1, wherein said analysis and measurement unit is configured to measure the signals in said at least two measurement paths in parallel or sequentially.

8. The apparatus according to claim 1, wherein said analysis and measurement unit has at least two operation modes, the first operation mode corresponding to measuring the signals in said at least two measurement paths sequentially, the second operation mode corresponding to measuring the signals in said at least two measurement paths in parallel.

9. The apparatus according to claim 1, wherein an adjustable attenuator is provided, said adjustable attenuator being connected with said analysis and measurement unit.

10. The apparatus according to claim 9, wherein said adjustable attenuator is positioned in front of said at least two measurement paths.

11. The apparatus according to claim 1, wherein said analysis and measurement unit is configured to at least one of average the power of said wide bandwidth signal and to determine the peak value of the power of said wide bandwidth signal.

12. The apparatus according to claim 1, wherein an internal splitter is provided that is assigned to an input of the apparatus, said splitter splitting a radio frequency signal received via said input, said splitter forwarding the split signals to said at least two measurement paths.

13. The apparatus according to claim 1, wherein a display is provided that is connected with said analysis and measurement unit so that measurement and analysis results are displayed on said display.

14. A method of analyzing a radio frequency signal, with the following steps:

receiving a radio frequency signal via a single apparatus having a housing that houses two different measurement paths;

processing said radio frequency signal received via the single apparatus so as to obtain at least one small bandwidth signal and at least one wide bandwidth signal since said at least two measurements paths process different signals with regard to the bandwidth; and measuring the power of at least one of said at least one small bandwidth signal and said at least one wide bandwidth signal by using the single apparatus, wherein at least one of a too high power, a wrong attenuator setting or a wrong frequency range for said at least one measurement path for small bandwidth is indicated by comparing at least one predefined threshold value with an absolute power of said at least one small bandwidth signal and/or said at least one wide bandwidth signal.

15. The method according to claim 14, wherein at least one predefined threshold value is compared with a difference in power of said at least one small bandwidth signal and said at least one wide bandwidth signal.

16. The method according to claim 14, wherein said radio frequency signal received is at least one of attenuated and split.

17. The method according to claim 14, wherein said radio frequency signal received is down-converted so as to obtain said at least one small bandwidth signal.

18. The method according to claim 14, wherein the power of said wide bandwidth signal is averaged or the peak value of the power of said high bandwidth signal is taken into account.

* * * * *